(12) United States Patent
Bhimarasetti et al.

(10) Patent No.: US 10,355,093 B2
(45) Date of Patent: Jul. 16, 2019

(54) NON-PLANAR SEMICONDUCTOR DEVICE HAVING OMEGA-FIN WITH DOPED SUB-FIN REGION AND METHOD TO FABRICATE SAME

(71) Applicant: Intel Corporation, Santa Clara, CA (US)

(72) Inventors: Gopinath Bhimarasetti, Portland, OR (US); Walid M. Hafez, Portland, OR (US); Joodong Park, Portland, OR (US); Weimin Han, Portland, OR (US); Raymond E. Cotner, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,796

(22) PCT Filed: Jun. 26, 2014

(86) PCT No.: PCT/US2014/044433
§ 371 (c)(1),
(2) Date: Aug. 31, 2016

(87) PCT Pub. No.: WO2015/199705
PCT Pub. Date: Dec. 30, 2015

(65) Prior Publication Data
US 2017/0069725 A1    Mar. 9, 2017

(51) Int. Cl.
*H01L 29/36* (2006.01)
*H01L 29/66* (2006.01)
(Continued)

(52) U.S. Cl.
CPC ...... *H01L 29/36* (2013.01); *H01L 21/823431* (2013.01); *H01L 21/823475* (2013.01);
(Continued)

(58) Field of Classification Search
None
See application file for complete search history.

(56) References Cited

U.S. PATENT DOCUMENTS 9,620,642 B2 * 4/2017 Toh ...................... H01L 29/785
2005/0199920 A1   9/2005 Lee et al.
(Continued)

FOREIGN PATENT DOCUMENTS

CN    102651320    8/2012
CN    103811339    5/2014
(Continued)

OTHER PUBLICATIONS

Office Action for Taiwan Patent Application No. 105132211, dated Apr. 25, 2017, 6 pgs.
(Continued)

*Primary Examiner* — Abul Kalam
(74) *Attorney, Agent, or Firm* — Schwabe, Williamson & Wyatt, P.C.

(57) ABSTRACT

Non-planar semiconductor devices having omega-fins with doped sub-fin regions and methods of fabricating non-planar semiconductor devices having omega-fins with doped sub-fin regions are described. For example, a semiconductor device includes a plurality of semiconductor fins disposed above a semiconductor substrate, each semiconductor fin having a sub-fin portion below a protruding portion, the sub-fin portion narrower than the protruding portion. A solid state dopant source layer is disposed above the semiconductor substrate, conformal with the sub-fin region but not the protruding portion of each of the plurality of semiconductor
(Continued)

fins. An isolation layer is disposed above the solid state dopant source layer and between the sub-fin regions of the plurality of semiconductor fins. A gate stack is disposed above the isolation layer and conformal with the protruding portions of each of the plurality of semiconductor fins.

27 Claims, 6 Drawing Sheets

(51) Int. Cl.
*H01L 29/78* (2006.01)
*H01L 21/8234* (2006.01)
*H01L 27/088* (2006.01)

(52) U.S. Cl.
CPC .. *H01L 21/823481* (2013.01); *H01L 27/0886* (2013.01); *H01L 29/66545* (2013.01); *H01L 29/66803* (2013.01); *H01L 29/66818* (2013.01); *H01L 29/7853* (2013.01)

(56) References Cited

U.S. PATENT DOCUMENTS

| | | | |
|---|---|---|---|
| 2007/0102763 A1 | 5/2007 | Yeo et al. | |
| 2008/0001171 A1* | 1/2008 | Tezuka | H01L 21/823807 257/191 |
| 2009/0001415 A1 | 1/2009 | Lindert et al. | |
| 2010/0163971 A1* | 7/2010 | Hung | H01L 29/66795 257/327 |
| 2011/0175163 A1 | 7/2011 | Cartier et al. | |
| 2011/0309333 A1 | 12/2011 | Cheng et al. | |
| 2013/0115763 A1 | 5/2013 | Takamure et al. | |
| 2013/0280883 A1 | 10/2013 | Faul et al. | |
| 2013/0316513 A1* | 11/2013 | Basker | H01L 21/845 438/400 |
| 2014/0117462 A1 | 5/2014 | Cheng et al. | |
| 2014/0175561 A1* | 6/2014 | Colinge | H01L 29/785 257/401 |
| 2015/0102411 A1* | 4/2015 | Ching | H01L 21/76205 257/347 |
| 2015/0221761 A1* | 8/2015 | Tan | H01L 29/785 257/347 |
| 2016/0056156 A1 | 2/2016 | Ghani et al. | |
| 2016/0190319 A1* | 6/2016 | Kavalieros | H01L 29/267 257/190 |
| 2016/0260715 A1* | 9/2016 | Chung | H01L 27/0886 |
| 2017/0194458 A1* | 7/2017 | Chang | H01L 29/66545 |
| 2017/0243791 A1* | 8/2017 | Jacob | H01L 21/823814 |

FOREIGN PATENT DOCUMENTS

| | | |
|---|---|---|
| JP | H02-012916 A | 1/1990 |
| JP | 2002-217379 A | 8/2002 |
| JP | 2005-528793 | 9/2005 |
| JP | 2006-310458 A | 11/2006 |
| JP | 2009-272348 | 11/2009 |
| JP | 2010-21520 | 1/2010 |

OTHER PUBLICATIONS

International Preliminary Report on Patentability for PCT Patent Application No. PCT/US2014/044433, dated Jan. 5, 2017, 7 pgs.
Non-Final Office Action and Search Report for Taiwan Patent Application No. 104116285 dated May 11, 2016, 3 pgs.
International Search Report and Written Opinion for PCT Patent Application No. PCT/US2014/044433, dated Mar. 26, 2015, 10 pages.
Search Report for European Patent App. No. 14895725.1, dated Jan. 22, 2018, 12 pages.
Office Action for Japanese Patent Application No. 2017-043442 dated Nov. 27, 2017, 4 pages.
Notice of Allowance for Taiwan Patent Application No. 104116285, dated Sep. 2, 2016 2 pages.
Notice of Allowance for Taiwan Patent Application No. 105132211, dated Oct. 6, 2017, 2 pages.
European Search Report for European Patent Application No. 14895725.1 dated Apr. 24, 2018, 11 pages.
Preliminary Exam Report from Malaysian Patent Application No. PI2016704391 dated Apr. 19, 2017, 2 pages.
Notice of Allowance for Japanese Patent Application No. 2017-043442 dated Apr. 3, 2018, 1 page.
Office Action for Japanese Patent Application No. 2016-567916, dated Mar. 20, 2018, 6 pages.

* cited by examiner

NON-PLANAR SEMICONDUCTOR DEVICE HAVING OMEGA-FIN WITH DOPED SUB-FIN REGION AND METHOD TO FABRICATE SAME

CLAIM OF PRIORITY

This patent application is a U.S. National Phase application under 35 U.S.C. § 371 of International Application No. PCT/US2014/044433, filed Jun. 26, 2014, entitled "NON-PLANAR SEMICONDUCTOR DEVICE HAVING OMEGA-FIN WITH DOPED SUB-FIN REGION AND METHOD TO FABRICATE SAME," the entire contents of which are incorporated herein by reference.

TECHNICAL FIELD

Embodiments of the invention are in the field of semiconductor devices and processing and, in particular, non-planar semiconductor devices having omega-fins with doped sub-fin regions and methods of fabricating non-planar semiconductor devices having omega-fins with doped sub-fin regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIGS. 2A-2I illustrate cross-sectional view of various operations in an method of fabricating a non-planar semiconductor device having omega-fins with doped sub-fin regions, in accordance with an embodiment of the present invention where:

DESCRIPTION OF THE EMBODIMENTS

Non-planar semiconductor devices having omega-fins with doped sub-fin regions and methods of fabricating non-planar semiconductor devices having omega-fins with doped sub-fin regions are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to approaches for fabricating omega-fins for enhanced sub-fin doping. Applications may include, but are not limited to, sub-10 nm process technology nodes. In one or more embodiments, both a solid-state sub-fin doping source technique and a catalytic oxidation of sub-fin region technique are utilized for semiconductor device fabrication.

More specifically, one or more embodiments described herein provide approaches for fabricating omega-fin structures. Such omega-fin structures can facilitate enhanced sub-fin doping in tightly spaced fins for, e.g., sub-10 nm technology nodes. Sub-fin doping may be achieved by depositing boron or phosphorous doped oxides (BSG/PSG)

followed by a capping SiN layer. An anneal process is used to drive the dopants from the BSG or PSG layer into the sub-fin. The extent of doping into the sub-fin is directly related to the thickness of the BSG or PSG layer. Additionally, a minimum thickness of SiN may be needed to drive the dopants into the sub-fin instead of dopants escaping into the space between the fins. However, a combination of the minimum required BSG/PSG and SiN thicknesses can render achieving sub doping difficult as the fin pitch is reduced. Although fin pitches can be scaled, the BSG/PSG and SiN thicknesses may not be proportionally scaled, posing a challenge. Embodiments described herein provide for fabrication of a sub-fin width that is reduced relative to the active (protruding) fin portion, resulting in omega-fins. In one such embodiment, the fabrication of omega-fins provides extra space in the sub-fin regions, even after reducing the fin-pitch, for depositing the required BSG/PSG or SiN layer thicknesses.

Figure 1A:
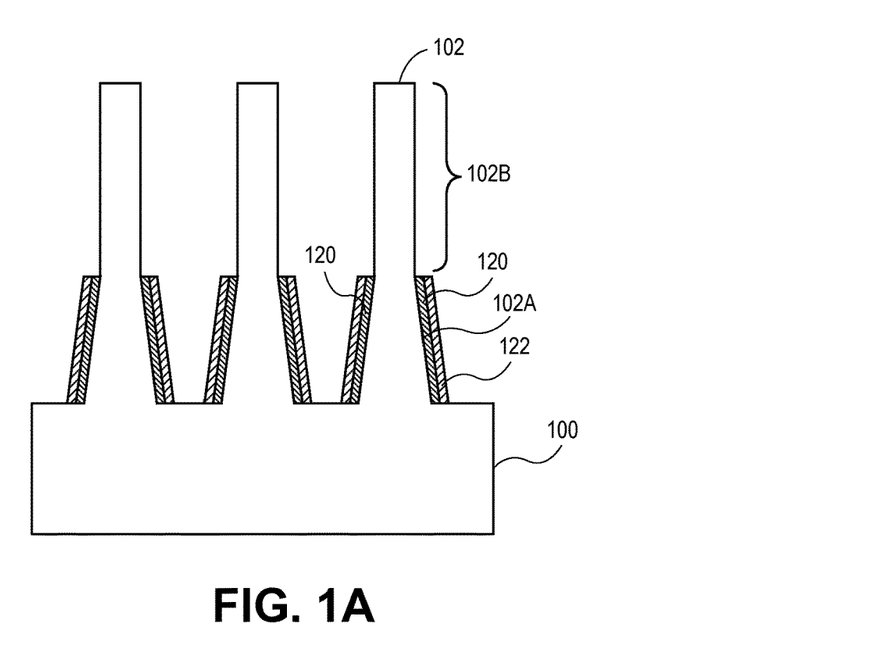
FIG. 1A is a cross-sectional view of a portion of a non-planar semiconductor device having outwardly-tapered with doped sub-fin regions.

To provide a reference point for some of the concepts involved herein, FIG. 1A is a cross-sectional view of a portion of a non-planar semiconductor device having outwardly-tapered with doped sub-fin regions. Referring to FIG. 1A, a bulk silicon substrate 100 is provided having fins 102 etched therein. The fins 102 are formed directly in the bulk substrate 100 and, as such, are formed continuous with the bulk substrate 100. Each fin 102 may be described as having a sub-fin region 102A and a protruding portion 102B. The protruding portion 102B is ultimately the portion on which a gate electrode is formed. As depicted in FIG. 1A, each sub-fin region 102A is outwardly tapered. A solid state dopant source layer 120 and optional capping layer 122 are confined to the sub-fin regions 102A. The solid state dopant source layer 120 may ultimately be used to dope the sub-fin regions 102A. As described above, due at least in part to the outward taper of the sub-fin regions 102A, the lower portions of the fins 102 and, hence, the solid state dopant source layer 120 and optional capping layer 122, are in close proximity to one another, rendering scaling of such features quite difficult.

To provide further context, approaches that have been implemented to address scaling challenges have involved one or more of (a) increasing the dopant concentration in the solid state dopant source layer (e.g., in BSG/PSG) or (b) increasing the density of the capping layer (e.g., SiN) to prevent dopant "escape" to the space between fins. Generally, embodiments described herein enable an opening up of space in the sub-fin region to facilitate deposition the required BSG/PSG and SiN films. In one such embodiment, the process of creating space in the sub-fin region is achieved by selective catalytic oxidation, as is described in greater detail below.

Figure 1B:
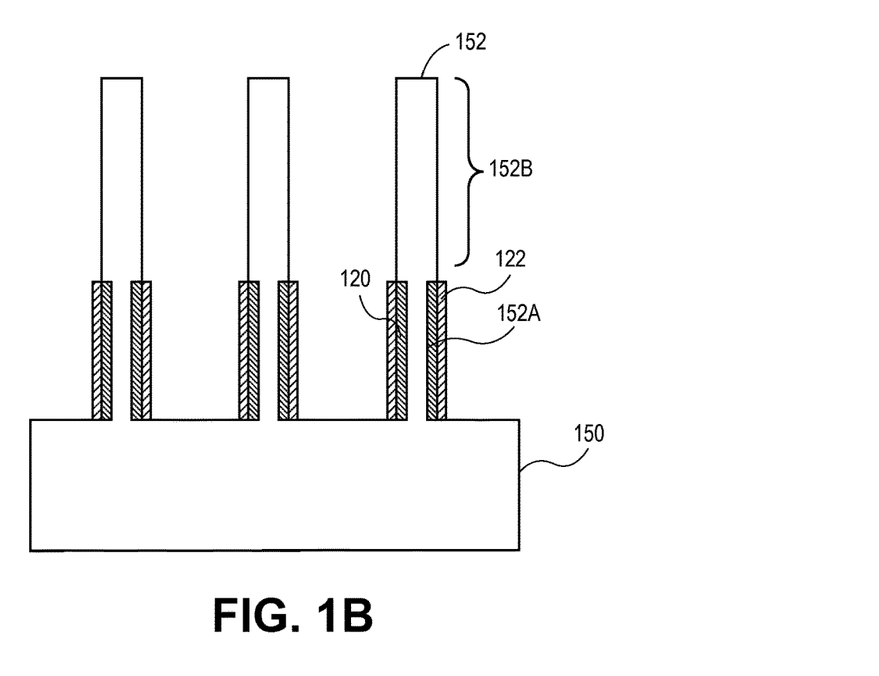
FIG. 1B is a cross-sectional view of a portion of a non-planar semiconductor device having omega-fins with doped sub-fin regions, in accordance with an embodiment of the present invention.

Thus, by contrast to FIG. 1A, FIG. 1B is a cross-sectional view of a portion of a non-planar semiconductor device having omega-fins with doped sub-fin regions, in accordance with an embodiment of the present invention. Referring to FIG. 1B, a bulk silicon substrate 150 is provided having omega-fins 152 etched therein. The omega-fins 152 are formed directly in the bulk substrate 150 and, as such, are formed continuous with the bulk substrate 150. Each omega-fin 152 may be described as having a sub-fin region 152A and a protruding portion 152B. The protruding portion 152B is ultimately the portion on which a gate electrode is formed.

As depicted in FIG. 1B, each sub-fin region 152A is narrower than the corresponding protruding portion 152B. A solid state dopant source layer 120 and optional capping layer 122 are confined to the sub-fin regions 152A. The solid state dopant source layer 120 may ultimately be used to dope the sub-fin regions 152A. As described above, due at least in part to the omega-fin geometry, the lower portions of the omega-fins 152 and, hence, the solid state dopant source layer 120 and optional capping layer 122, are in not in relative close proximity to one another, rendering scaling of such features feasible.

In a particular implementation, a process flow for creating omega-fin structures involves use of an oxidation catalyst layer deposited by atomic layer deposition (ALD) to provide the catalyst on all exposed surfaces of the fin. However, the catalyst may only be needed in the sub-fin regions of a plurality of semiconductor fins. Therefore, a process is described below which protects the catalyst in the sub-fin region, while removing the catalyst from the active fin regions. In one embodiment, this approach is accomplished by using a carbon hard mask (CHM) to fill spaces between fins after catalyst deposition. The CHM is then recessed using, e.g., a dry etch technique to the desired depth. Once the CHM is recessed, the exposed catalyst in the active fin region is removed, e.g., by a wet etch process. The CHM which remains in the spaces in the sub-fin region can be removed by an ash technique, thus leaving the catalyst exposed in the sub-fin region. At this stage, low pressure oxidation can be used to oxidize the silicon in the sub-fin region. The presence of the catalyst in the sub-fin region accelerates the oxidation approximately 10-15 times faster than the active fin region where the catalyst has been previously removed. After the oxidation is performed, the catalyst and the oxide can be removed by wet etch resulting in omega-fin structures.

In an exemplary process scheme, FIGS. 2A-2I illustrate cross-sectional view of various operations in a method of fabricating a non-planar semiconductor device having omega-fins with doped sub-fin regions, in accordance with an embodiment of the present invention.

Figure 2A:
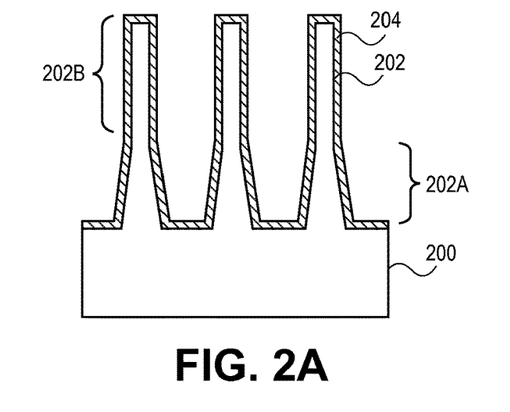
FIG. 2A illustrates a bulk semiconductor substrate having fins etched therein and a catalyst layer formed conformal therewith.

Referring to FIG. 2A, a bulk semiconductor substrate 200, such as a bulk single crystalline silicon substrate is provided having fins 202 etched therein.

In an embodiment, the fins are formed directly in the bulk substrate 200 and, as such, are formed continuous with the bulk substrate 200. Artifacts remaining from the fabrication of fins 202 may also be present. For example, although not depicted, a hardmask layer, such as a silicon nitride hardmask layer, and a pad oxide layer, such as a silicon dioxide layer, may remain atop fins 202. In one embodiment, the bulk substrate 200 and, hence, the fins 202, are undoped or lightly doped at this stage. For example, in a particular embodiment, the bulk substrate 200 and, hence, the fins 202, have a concentration of less than approximately 1E17 atoms/cm$^3$ of boron dopant impurity atoms. Furthermore, each fin 202 may be described as having a sub-fin region 202A and a protruding portion 202B. The protruding portion 202B is ultimately the portion on which a gate electrode is formed. At this stage, the each sub-fin region 202A may be outwardly tapered as a result of the etch process used to form the fins 202, as is depicted in FIG. 2A.

Referring again to FIG. 2A, a catalyst layer 204 is formed conformal with the substrate 200/fins 202 structure. In an embodiment, the catalyst layer is a layer of aluminum oxide $(Al_2O_3)$. It is to be appreciated that, if present, a hardmask layer and/or a pad oxide layer may remain atop fins 202 at this stage. However, as shown, such a hardmask layer and/or pad oxide layer used in fin formation have been removed prior to the formation of the catalyst layer 204, as is depicted in FIG. 2A.

Figure 2B:
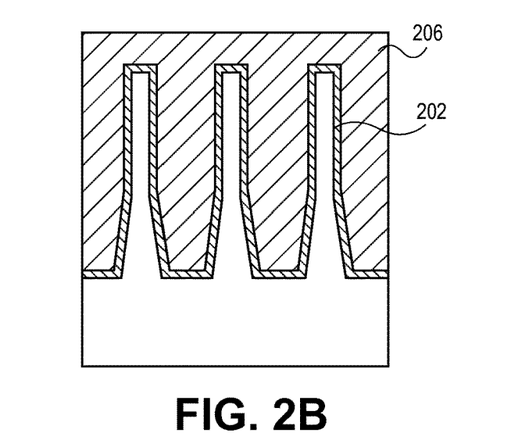
FIG. 2B illustrates the structure of FIG. 2A following formation of a mask on and above the plurality of fins.

Referring to FIG. 2B, a mask 206 is formed on the structure of FIG. 2A.

In an embodiment, the mask 206 is formed to a height sufficient to completely cover the fins 202. The hardmask may be formed to have an essentially planar top surface or may be subjected to a planarization process such as chemical mechanical planarization (CMP). In one embodiment, the mask 206 is or includes a carbon hardmask (CHM) material layer.

Figure 2C:
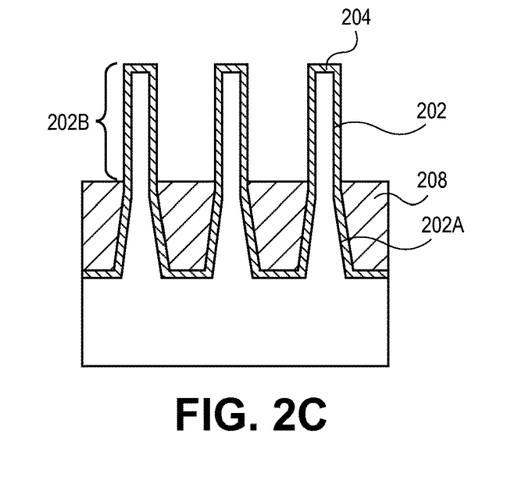
FIG. 2C illustrates the structure of FIG. 2B following recessing of the mask to form a recessed mask.

Referring to FIG. 2C, the mask 206 of FIG. 2B is recessed to a height below the tops of the fins 202, forming a recessed mask 208.

In an embodiment, the recessed mask 208 is formed to a level essentially co-planar with the tops of the sub-fin regions 202A, exposing the protruding portions 202B and a portion of the catalyst layer 204, as is depicted in FIG. 2C. In an embodiment, recessing of the mask 206 to form recessed mask 208 is performed by an etch process such as, but not limited to, a plasma, vapor, ashing or wet etch process, or combination thereof. In one embodiment, the mask 206 is a carbon hardmask layer and is recessed using an ashing process based on oxygen.

Figure 2D:
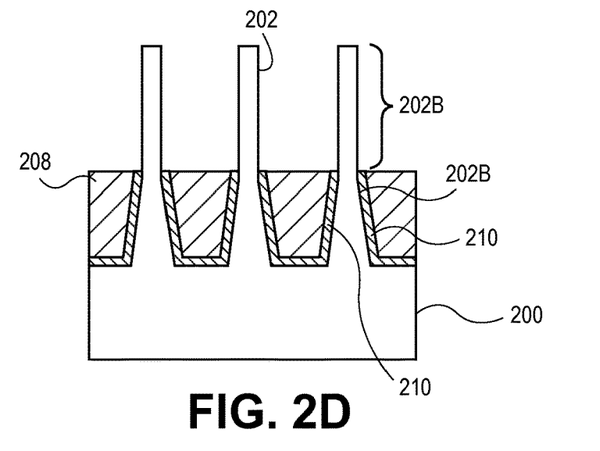
FIG. 2D illustrates the structure of FIG. 2C following removal of exposed portions of the catalyst layer.

Referring to FIG. 2D, the exposed portions of the catalyst layer 204 are removed to provide a patterned catalyst layer 210 which is confined to regions protected by recessed mask 208.

In one such embodiment, the patterned catalyst layer 210 is confined to the sub-fin regions 202A, as is depicted in FIG. 2D. In an embodiment, removal of the exposed portions of the catalysts layer 204 to form the patterned catalyst layer 210 is performed using a wet etch process. In one such embodiment, the catalyst layer is or includes a layer of $Al_2O_3$, and the wet etch process is based on hydrofluoric acid (HF). In an embodiment, the wet etch process is selective to the recessed mask 208, as is depicted in FIG. 2D.

Figure 2E:
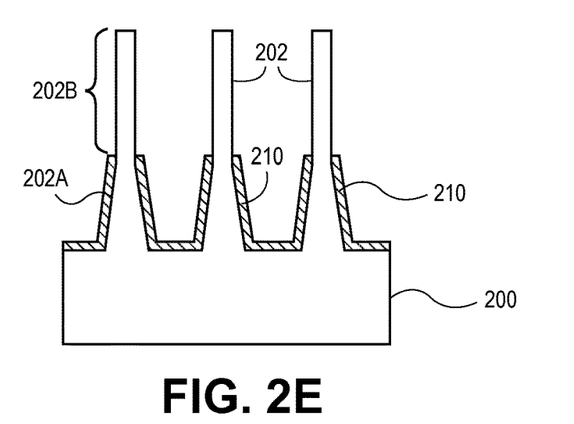
FIG. 2E illustrates the structure of FIG. 2D following removal of the recessed mask to expose the patterned catalyst layer.

Referring to FIG. 2E, the recessed mask 208 is completely removed, exposing the patterned catalyst layer 210.

In an embodiment, removal of the recessed mask 208 is performed by an etch process such as, but not limited to, a plasma, vapor, ashing or wet etch process, or combination thereof. In one embodiment, the recessed mask 208 is a carbon hardmask layer and is removed using an ashing process based on oxygen. In an embodiment, removal of the recessed mask 208 is performed using a process selective to the patterned catalysts layer 210, preserving the patterned catalyst layer 210, as is depicted in FIG. 2E.

Figure 2F:
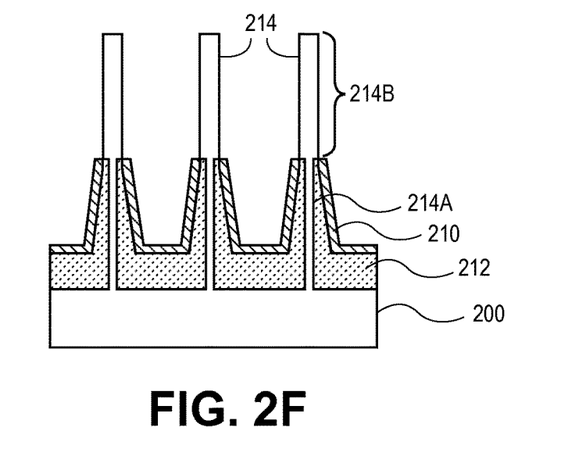
FIG. 2F illustrates the structure of FIG. 2E following catalytic oxidation of the sub-fin regions.

Referring to FIG. 2F, using the patterned catalyst layer 210, oxidation of the sub-fin regions 202A of the plurality of fins 202 is performed.

In an embodiment, the oxidation is performed by exposing the patterned catalyst layer 210 to a combination of hydrogen and oxygen ($H_2/O_2$) under reduced pressure. During the oxidation process, in regions of the fins 202 having the patterned catalyst layer 210 thereon (i.e., the sub-fin regions 202A), the patterned catalyst layer 210 accelerates the oxidation of the underlying/adjacent silicon approximately 10-15 times faster than the oxidation of other portions of the silicon fins (i.e., the oxidation rate of the sub-fin regions 202A is approximately 10-15 times faster than the oxidation rate of the protruding fin portions 202B because of the presence of the patterned catalysts layer 210). Accordingly, such selective catalytic oxidation enables relatively rapid conversion of the sub-fin regions 202A into an oxide layer 212 (such as silicon oxide or silicon dioxide) without significantly oxidizing the protruding portions 202B of the fins 202. Accordingly, in one embodiment, the remaining silicon of the fins 202 provides for omega-fins 214 having sub-fin regions 214A narrower than the overlying protruding fin portions 214B, as is depicted in FIG. 2F. It is to be appreciated that at least some oxidation may occur on the protruding portions 202B of the fins 202; however, the extent of oxidation is negligible as compared to the sub-fin regions 202A.

Figure 2G:
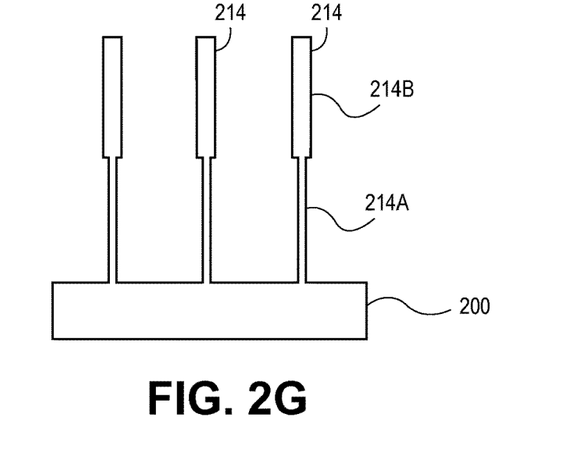
FIG. 2G illustrates the structure of FIG. 2F following removal of the patterned catalyst layer and the formed oxide layer.

Referring to FIG. 2G, the patterned catalyst layer 210 and the oxide layer 212 are removed to reveal the sub-fin regions 214A and the protruding regions 214B of the omega-fins 214.

In one such embodiment, the catalyst layer is or includes a layer of $Al_2O_3$, the oxide layer 212 is or includes a layer of $SiO_2$, and the wet etch process is based on hydrofluoric acid (HF). In a particular embodiment, the patterned catalyst layer 210 and the oxide layer 212 are removed in a single wet etch operation. However, in other embodiments, the patterned catalyst layer 210 and the oxide layer 212 are removed in successive wet etch operations.

Figure 2H:
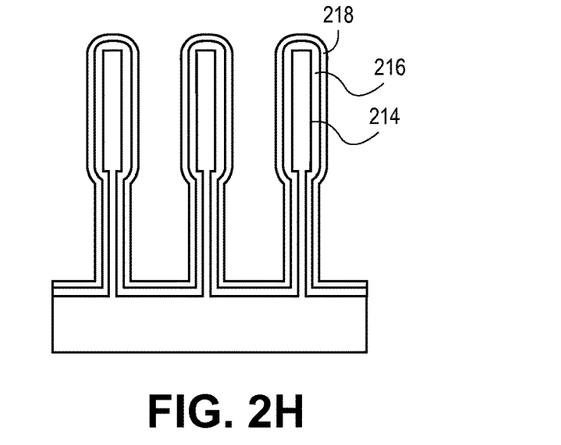
FIG. 2H illustrates the structure of FIG. 2G following formation of a solid state dopant source layer and optional capping layer.

Referring to FIG. 2H, a solid state dopant source layer 216 is formed conformal with the substrate 200/omega-fins 214 structure of FIG. 2G.

In a first embodiment, the solid state dopant source layer 216 is a P-type solid state dopant source layer composed of a dielectric layer incorporating P-type dopants therein such as, but not limited to, a P-type doped oxide, nitride or carbide layer. In a specific such embodiment, the P-type solid state dopant source layer is a borosilicate glass layer. The P-type solid state dopant source layer may be formed by a process suitable to provide a conformal layer on the omega-fins 214. For example, in one embodiment, the P-type solid state dopant source layer is formed by a chemical vapor deposition (CVD) process or other deposition process (e.g., ALD, PECVD, PVD, HDP assisted CVD, low temp CVD) as a conformal layer above the entire structure of FIG. 2G. In a particular embodiment, the P-type solid state dopant source layer is a BSG layer having a boron concentration approximately in the range of 0.1-10 weight %.

In a second embodiment, the solid state dopant source layer 216 is an N-type solid state dopant source layer composed of a dielectric layer incorporating N-type dopants therein such as, but not limited to, an N-type doped oxide, nitride or carbide layer. In a specific such embodiment, the N-type solid state dopant source layer is a phosphosilicate glass layer or an arsenic silicate glass layer. The N-type solid state dopant source layer may be formed by a process suitable to provide a conformal layer on the omega-fins 214. For example, in one embodiment, the N-type solid state dopant source layer is formed by a chemical vapor deposition (CVD) process or other deposition process (e.g., ALD, PECVD, PVD, HDP assisted CVD, low temp CVD) as a conformal layer above the entire structure of FIG. 2G. In a particular embodiment, the N-type solid state dopant source layer is a PSG layer or an AsSG layer having a phosphorous or arsenic, respectively, concentration approximately in the range of 0.1-10 weight %.

In an embodiment, as is also depicted in FIG. 2H, a capping layer 218 is optionally formed on the solid state dopant source layer 216. In one such embodiment, the capping layer 218 is formed as an in situ-formed capping layer to protect the solid state dopant source layer 216 during subsequent exposure to ambient conditions. In a specific embodiment, the capping layer is a nitride layer, such as a silicon nitride layer.

Figure 2I:
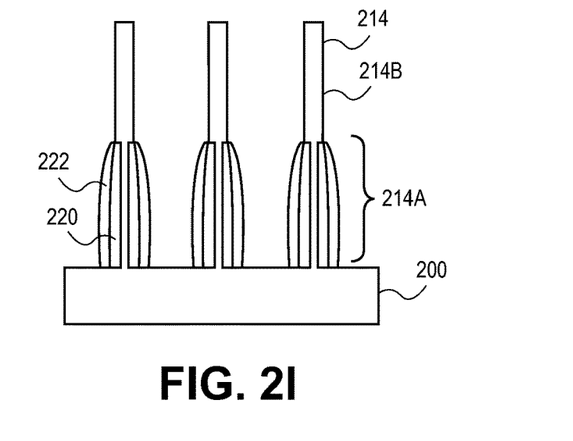
FIG. 2I illustrates the structure of FIG. 2H following patterning of the solid state dopant source layer and optional capping layer.

Referring to FIG. 2I, the solid state dopant source layer 216 and, if present, the capping layer 218 are patterned to form a patterned solid state dopant source layer 220 and a patterned capping layer 222.

In an embodiment, the solid state dopant source layer 216 and the capping layer 218 are patterned by a plasma, vapor or wet etch process. Patterning of the solid state dopant source layer 216 and the capping layer 218 may be performed in a same or different processing operation. Although not depicted, in an embodiment, the patterning involves first formation and then recessing of a dielectric fill layer formed over the structure of FIG. 2H. Such a dielectric fill layer may be recessed to expose protruding portions 214B of the omega-fins 214, while being recessed to a height approximately the same as the height of the sub-fin regions 214A. The solid state dopant source layer 216 and the capping layer 218 are sequentially of simultaneously recessed to approximately the same level as the dielectric fill layer. Accordingly, in one embodiment, the resulting patterned solid state dopant source layer 220 is confined to the sub-fin regions 214A of the plurality of omega-fins 214, as is depicted in FIG. 2I.

In an embodiment, subsequent to forming the patterned solid state dopant source layer 220 and the optional patterned capping layer 222, a drive-in anneal is performed to provide doped sub-fin regions 214A of the omega-fins 214. More particularly, upon heating, dopants from the patterned solid state dopant source layer 220, such as boron, phosphorous or arsenic dopant atoms, are diffused into the sub-fin regions 214A. The diffusion may also lead to doping within the bulk substrate portion 200, where adjacent fins 214 share a common doped region in the bulk substrate 200. In this manner, the protruding portions 214B of omega-fins 214 essentially retain the doping profile of the original bulk substrate 200 and fins 202 described in association with FIG. 2A. As a result, a doping profile interface may exist between the protruding portions 214B and the doped sub-fin regions (214A as now doped). In one such embodiment, the interface represents a doping concentration step or rapid gradient change where the doped sub-fin regions have a total dopant concentration of $2E18$ atoms/cm$^3$ or greater, while the protruding portions 214B have a total dopant concentration significantly less than $2E18$ atoms/cm$^3$, e.g., of approximately $5E17$ atoms/cm$^3$ or less. In an embodiment, the doped sub-fin regions are doped across the entire sub-fin region. In an embodiment, the drive-in operation is performed at a temperature approximately in the range of 800-1050 degrees Celsius.

Thus, one or embodiments described herein include use of a solid source doping layer (e.g., BSG, PSG or AsSG) deposited on fins subsequent to fin etch. Later, after a trench fill and polish, the doping layer is recessed along with the trench fill material to define the fin height (HSi) for the device. The operation removes the doping layer from the fin sidewalls above HSi. Therefore, the doping layer is present only along the fin sidewalls in the sub-fin region which ensures precise control of doping placement. After a drive-in anneal, high doping is limited to the sub-fin region, quickly transitioning to low doping in the adjacent region of the fin above HSi (which forms the channel region of the transistor).

In general, referring again to FIGS. 2A-2I, in an embodiment, borosilicate glass (BSG) is implemented for NMOS fin doping, while a phosphosilicate (PSG) or arsenic-silicate glass (AsSG) layer is implemented for PMOS fin doping. It is to be appreciated that, in an embodiment, a process scheme that involves both NMOS fin doping and PMOS fin doping for different respective fins on a common substrate may add some integration complexity but is well within the spirit and scope of embodiments of the present invention.

Referring more generally to FIGS. 1A, 1B and 2A-2I, one or more embodiments described herein is directed to a process to selectively dope sub-fin regions of tri-gate or FinFET transistors fabricated on bulk silicon wafers, e.g., by way of tri-gate doped glass sub-fin out-diffusion. For example, described above is a process to selectively dope a sub-fin region of tri-gate or FinFET transistors to mitigate sub-fin leakage while simultaneously keeping fin doping low. Incorporation of a solid state doping sources (e.g., p-type and n-type doped oxides, nitrides or carbides) into the transistor process flow, which after being recessed from the fin sidewalls, delivers well doping into the sub-fin region while keeping the fin body relatively undoped. Additionally, in an embodiment, one or more approaches described herein enables self-alignment of the bottom of an active portion of a bulk fin with a doping boundary between the active portion and the remaining bulk portion (e.g., the portion below the gate-controlled region).

For example, it may be desirable to use bulk silicon for fins or trigate. However, there is a concern that regions (sub-fin) below the active silicon fin portion of the device (e.g., the gate-controlled region, or HSi) is under diminished or no gate control. As such, if source or drain regions are at or below the HSi point, then leakage pathways may exist through the sub-fin region. In accordance with an embodiment of the present invention, in order to address the above issues, sufficient doping is provided through sub-fin doping without necessarily delivering the same level of doping to the HSi portions of the fins.

To provide further context, conventional approaches to addressing the above issues have involved the use of well implant operations, where the sub-fin region is heavily doped (e.g., much greater than $2E18/cm^3$), which shuts off sub-fin leakage but leads to substantial doping in the fin as well. The addition of halo implants further increases fin doping such that end of line fins are doped at a high level (e.g., greater than approximately $1E18/cm^3$). By contrast, one or more embodiments described herein provide low doping in the fin which may be beneficial since higher current drive is enabled by improving carrier mobility, which is otherwise degraded by ionized impurity scattering for high doped channel devices. Furthermore, since random variation of threshold voltage (Vt) is directly proportional to the square root of doping density, low doped devices also have the advantage of lowering the random mismatch in Vt. This enables products to operate at lower voltages without functional failures. At the same time, the region just below the fin (i.e. the sub-fin) must be highly doped in order to prevent sub-fin source-drain leakage. Conventional implant steps used to deliver this doping to the sub-fin region also dope the fin region substantially, making it impossible to achieve low doped fins and suppress sub-fin leakage at same time.

It is to be appreciated that the structures resulting from the above exemplary processing scheme, e.g., structures from FIG. 2I, may be used in a same or similar form for subsequent processing operations to complete device fabrication, such as PMOS and NMOS device fabrication. As an example of a completed device, FIGS. 3A and 3B illustrate a cross-sectional view and a plan view (taken along the a-a' axis of the cross-sectional view), respectively, of a non-planar semiconductor device having omega-fins with doped sub-fin regions, in accordance with an embodiment of the present invention.

Figure 3A:
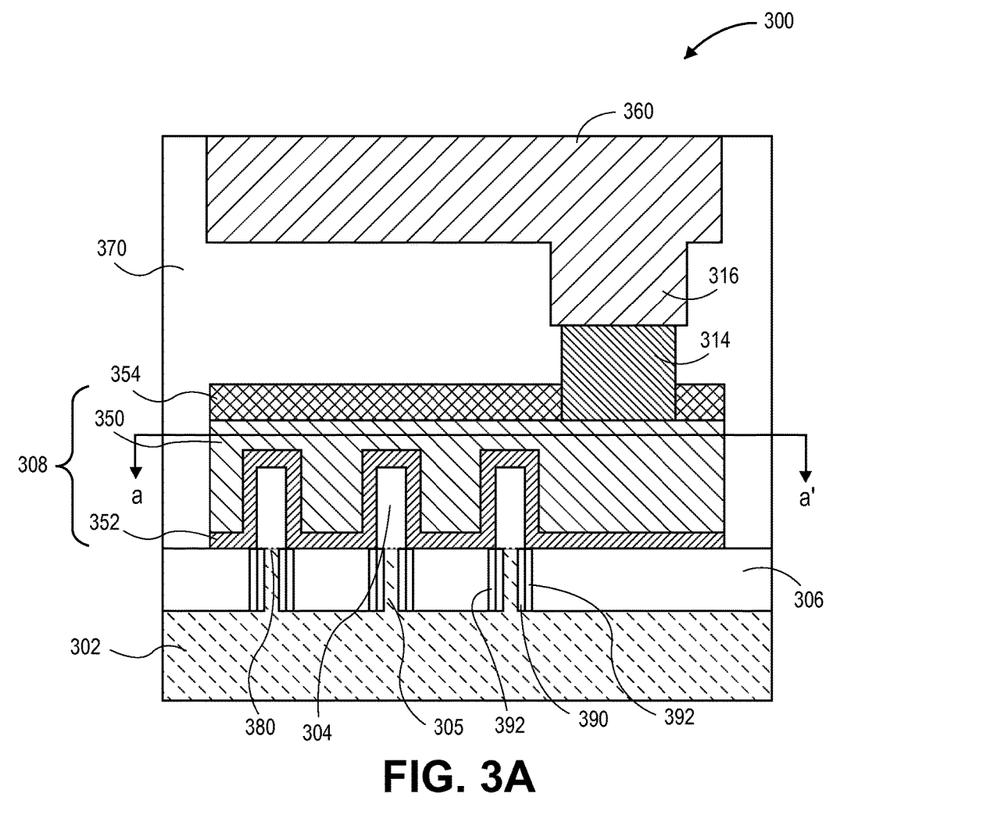
FIG. 3A illustrates a cross-sectional view of a non-planar semiconductor device having omega-fins with doped sub-fin regions, in accordance with an embodiment of the present invention.
Figure 3B:
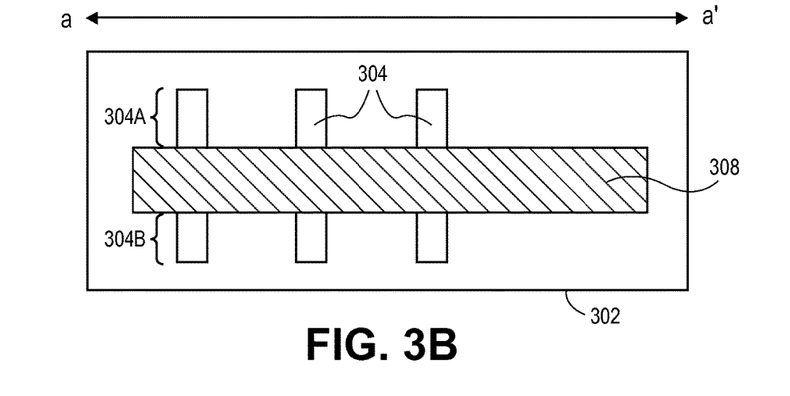
FIG. 3B illustrates a plan view taken along the a-a' axis of the semiconductor device of FIG. 3A, in accordance with an embodiment of the present invention.

Referring to FIG. 3A, a semiconductor structure or device 300 includes a non-planar active region (e.g., a fin structure including protruding fin portion 304 and sub-fin region 305) formed from substrate 302, and within isolation region 306. In accordance with an embodiment of the present invention, the sub-fin regions 305 are narrower than the corresponding protruding portions 304 and, as such, provide for an omega-fin geometry for the fins. Furthermore, in an embodiment, a solid state dopant source layer 390 and optional capping layer 392 may be retained in the structure, along the sidewalls of the sub-fin regions 305, corresponding to embodiments described above.

In one embodiment, each of the plurality of semiconductor fins 304/305 has an omega-fin geometry, as is depicted in FIG. 3A. In one embodiment, the protruding portion 304 of each of the plurality of semiconductor fins has a width of approximately 10 nanometers or less. In one embodiment, the solid state dopant source layer 390 has a top surface approximately co-planar with an interface between the sub-fin portion 305 and the protruding portion 304 of each of the plurality of semiconductor fins, as is depicted in FIG. 3A. In one embodiment, the isolation layer 306 has a top surface approximately co-planar with an interface between the sub-fin portion 305 and the protruding portion 304 of each of the plurality of semiconductor fins, as is depicted in FIG. 3A. In one embodiment, the solid state dopant source layer 390 is a borosilicate glass (BSG) layer. In one embodiment, the solid state dopant source layer 390 is a phosphosilicate glass (PSG) layer or an arsenic silicate glass (AsSG) layer. In one embodiment, the capping layer 392 is composed of silicon nitride. In one embodiment, the capping layer 392 has a top surface approximately co-planar with an interface between the sub-fin portion 305 and the protruding portion 304 of each of the plurality of semiconductor fins, as is depicted in FIG. 3A.

As is also depicted in FIG. 3A, in an embodiment, an interface 380 exists between the doping profile of protruding fin portion 304 and sub-fin region 305. The interface 380 can be a transition region that is relatively abrupt. One or more embodiments confine, or essentially confine, dopants from a doping process to a sub-fin region of a semiconductor device. As an example, the transition of doping concentration can drop quickly from the sub-fin region to the protruding fin region. In one such embodiment, the transition is essentially immediate with a dopant concentration of less than approximately 5E17 atoms/cm$^3$ for each of the protruding portions and of greater than approximately 2E18 atoms/cm$^3$ for the corresponding sub-fin regions. Furthermore, substrate portions below the sub-fin regions 305 may be doped, in one sense forming well regions. In one embodiment, the lower portions of the substrate 302 are doped at least in part by downward diffusion from a solid state doping source (such as layer 390) into the underlying substrate.

Referring again to FIG. 3A, a gate line 308 is disposed over the protruding portions 304 of the non-planar active region as well as over a portion of the isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3A, the gate contact 314 is, in one embodiment, disposed over isolation region 306, but not over the non-planar active regions.

Referring to FIG. 3B, the gate line 308 is shown as disposed over the protruding fin portions 304. Source and drain regions 304A and 304B of the protruding fin portions 304 can be seen from this perspective. In one embodiment, the source and drain regions 304A and 304B are doped portions of original material of the protruding fin portions 304. In another embodiment, the material of the protruding fin portions 304 is removed and replaced with another semiconductor material, e.g., by epitaxial deposition. In either case, the source and drain regions 304A and 304B may extend below the height of dielectric layer 306, i.e., into the sub-fin region 305. In accordance with an embodiment of the present invention, the more heavily doped sub-fin regions 305, i.e., the doped portions of the fins below interface 380, inhibits source to drain leakage through this portion of the bulk semiconductor fins.

In an embodiment, the semiconductor structure or device 300 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body, as is depicted in FIG. 3A.

Substrate 302 may be composed of a semiconductor material that can withstand a manufacturing process and in which charge can migrate. In an embodiment, substrate 302 is a bulk substrate composed of a crystalline silicon, silicon/germanium or germanium layer doped with a charge carrier, such as but not limited to phosphorus, arsenic, boron or a combination thereof, to form active region 304. In one embodiment, the concentration of silicon atoms in bulk substrate 302 is greater than 97%. In another embodiment, bulk substrate 302 is composed of an epitaxial layer grown atop a distinct crystalline substrate, e.g. a silicon epitaxial layer grown atop a boron-doped bulk silicon mono-crystalline substrate. Bulk substrate 302 may alternatively be composed of a group III-V material. In an embodiment, bulk substrate 302 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 302 is composed of a III-V material and the charge-carrier dopant impurity atoms are ones such as, but not limited to, carbon, silicon, germanium, oxygen, sulfur, selenium or tellurium.

Isolation region 306 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 306 is composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 302. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Although not depicted, spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 300 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 308 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 300. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 3A, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller (such as 7 nm) technology node.

Figure 4:
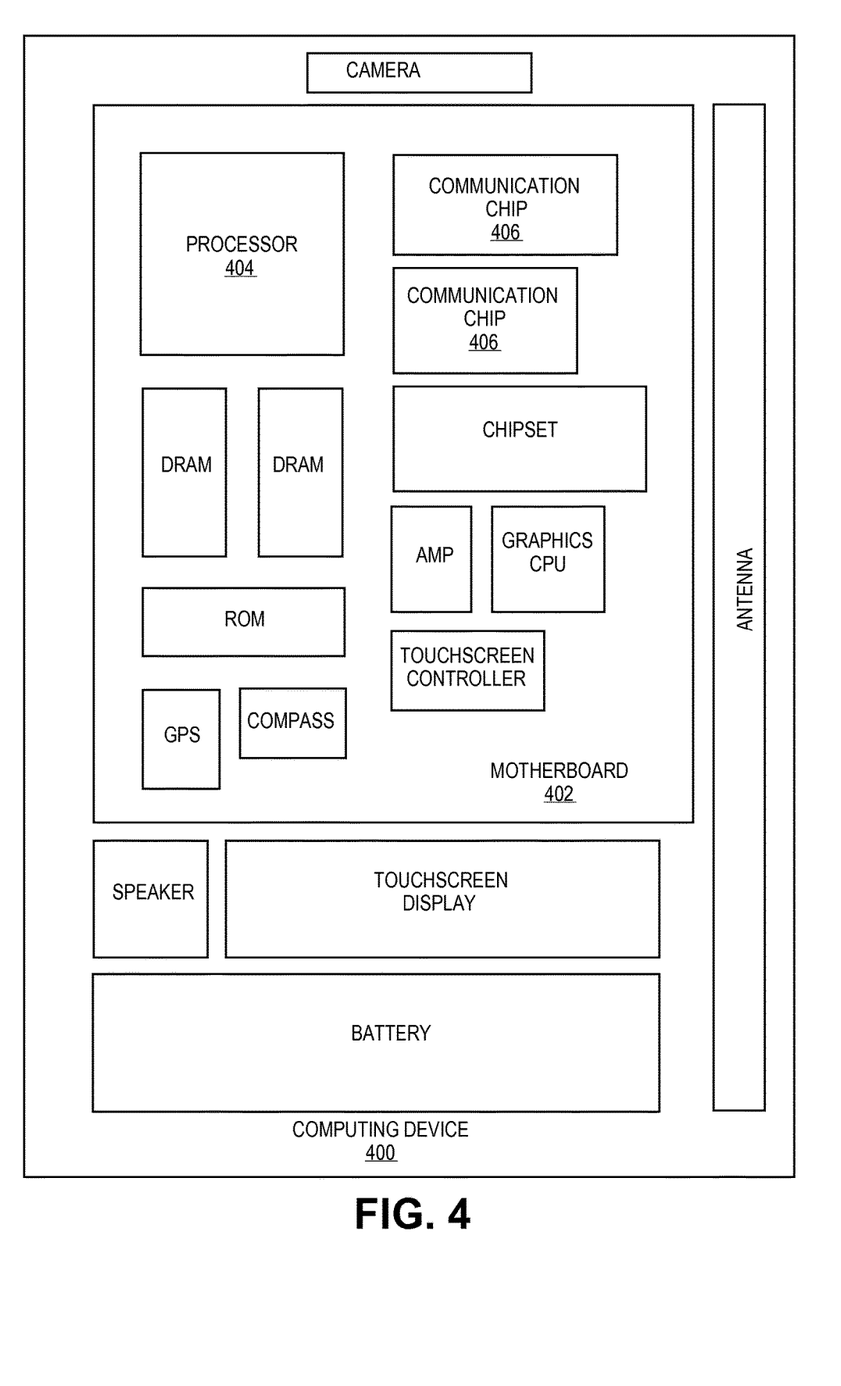
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of embodiments of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of embodiments of the invention.

In various embodiments, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Thus, embodiments of the present invention include non-planar semiconductor devices having omega-fins with doped sub-fin regions and methods of fabricating non-planar semiconductor devices having omega-fins with doped sub-fin regions.

In an embodiment, a semiconductor device includes a plurality of semiconductor fins disposed above a semiconductor substrate, each semiconductor fin having a sub-fin portion below a protruding portion, the sub-fin portion narrower than the protruding portion. A solid state dopant source layer is disposed above the semiconductor substrate, conformal with the sub-fin region but not the protruding portion of each of the plurality of semiconductor fins. An isolation layer is disposed above the solid state dopant source layer and between the sub-fin regions of the plurality of semiconductor fins. A gate stack is disposed above the isolation layer and conformal with the protruding portions of each of the plurality of semiconductor fins, the gate stack including a gate dielectric layer and gate electrode. Source and drain regions are disposed in the protruding portions of each of the plurality of semiconductor fins, on either side of the gate stack.

In one embodiment, each of the plurality of semiconductor fins has an omega-fin geometry.

In one embodiment, the protruding portion of each of the plurality of semiconductor fins has a width of approximately 10 nanometers or less.

In one embodiment, the solid state dopant source layer has a top surface approximately co-planar with an interface between the sub-fin portion and the protruding portion of each of the plurality of semiconductor fins.

In one embodiment, the isolation layer has a top surface approximately co-planar with an interface between the sub-fin portion and the protruding portion of each of the plurality of semiconductor fins.

In one embodiment, the solid state dopant source layer is a borosilicate glass (BSG) layer.

In one embodiment, the solid state dopant source layer is a phosphosilicate glass (PSG) layer or an arsenic silicate glass (AsSG) layer.

In one embodiment, the semiconductor device further includes a capping layer disposed on and conformal with the solid state dopant source layer. The isolation layer is disposed on the capping layer.

In one embodiment, the capping layer is composed of silicon nitride and has a top surface approximately co-planar with an interface between the sub-fin portion and the protruding portion of each of the plurality of semiconductor fins.

In one embodiment, the semiconductor device further includes a dopant concentration interface between each protruding portion and corresponding sub-fin portion of each of the plurality of semiconductor fins.

In one embodiment, the dopant concentration interface is an abrupt transition of less than approximately 5E17 atoms/$cm^3$ for each protruding portion and of greater than approximately 2E18 atoms/$cm^3$ for the corresponding sub-fin portion of each of the plurality of semiconductor fins.

In one embodiment, the plurality of semiconductor fins disposed above the semiconductor substrate is a plurality of single crystalline silicon fins continuous with a bulk single crystalline silicon substrate.

In an embodiment, a semiconductor device includes a plurality of semiconductor fins disposed above a semiconductor substrate, each semiconductor fin having a sub-fin portion below a protruding portion, the sub-fin portion narrower than the protruding portion. A dopant concentration interface is between each protruding portion and corresponding sub-fin portion of each of the plurality of semiconductor fins. An isolation layer is disposed between the sub-fin regions of the plurality of semiconductor fins. A gate stack is disposed above the isolation layer and is conformal with the protruding portions of each of the plurality of semiconductor fins, the gate stack including a gate dielectric layer and gate electrode. Source and drain regions are disposed in the protruding portions of each of the plurality of semiconductor fins, on either side of the gate stack.

In one embodiment, each of the plurality of semiconductor fins has an omega-fin geometry.

In one embodiment, the protruding portion of each of the plurality of semiconductor fins has a width of approximately 10 nanometers or less.

In one embodiment, the isolation layer has a top surface approximately co-planar with an interface between the sub-fin portion and the protruding portion of each of the plurality of semiconductor fins.

In one embodiment, the dopant concentration interface is an abrupt transition of less than approximately 5E17 atoms/$cm^3$ for each protruding portion and of greater than approximately 2E18 atoms/$cm^3$ for the corresponding sub-fin portion of each of the plurality of semiconductor fins.

In one embodiment, the plurality of semiconductor fins disposed above the semiconductor substrate is a plurality of single crystalline silicon fins continuous with a bulk single crystalline silicon substrate.

In an embodiment, a method of fabricating a semiconductor device involves forming a plurality of semiconductor fins above a semiconductor substrate. The method also involves forming a catalyst layer above the semiconductor substrate, conformal with the plurality of semiconductor fins. The method also involves forming a mask above the catalyst layer. The method also involves recessing the mask and the catalyst layer to approximately a same level below a top surface of the plurality of semiconductor fins, exposing protruding portions of each of the plurality of semiconductor fins above sub-fin regions of each of the plurality of semiconductor fins. The method also involves oxidizing outer portions of the sub-fin regions of each of the plurality of semiconductor fins using the catalyst layer to catalytically oxidize the sub-fin regions. The method also involves removing oxide formed from the oxidizing to provide a plurality of omega-fins having sub-fin regions narrower than corresponding protruding proportions.

In one embodiment, the plurality of semiconductor fins is a plurality of silicon fins, and forming the catalyst layer involves forming a layer of $Al_2O_3$ conformal with the plurality of silicon fins.

In one embodiment, oxidizing the outer portions of the sub-fin regions involves exposing the layer of $Al_2O_3$ to a combination of hydrogen and oxygen ($H_2/O_2$).

In one embodiment, the method further involves, subsequent to providing the plurality of omega-fins, forming a solid state dopant source layer above the semiconductor substrate, conformal with the plurality of omega-fins. The solid state dopant source layer is then recessed to be approximately co-planar with the sub-fin regions of the plurality of omega-fins. Dopants from the solid state dopant source layer are then driven into the sub-fin regions of each of the plurality of omega-fins.

In one embodiment, forming the solid state dopant source layer involves forming a borosilicate glass (BSG) layer.

In one embodiment, forming the solid state dopant source layer involves forming a phosphosilicate glass (PSG) layer or an arsenic silicate glass (AsSG) layer.

In one embodiment, the method further involves forming a gate stack conformal with the protruding portions of each of the plurality of omega-fins. Source and drain regions are then formed in the protruding portions of each of the plurality of omega-fins, on either side of the gate stack.

What is claimed is:

1. A semiconductor device, comprising:
   a plurality of semiconductor fins disposed above a semiconductor substrate, each semiconductor fin having a sub-fin portion below a protruding portion, the sub-fin portion narrower than the protruding portion;
   a solid state dopant source layer disposed above the semiconductor substrate, the solid state dopant source layer conformal with the sub-fin portion but not disposed on the protruding portion of each of the plurality of semiconductor fins;
   an isolation layer disposed adjacent to the solid state dopant source layer and between the sub-fin portions of the plurality of semiconductor fins;
   a gate stack disposed above the isolation layer and conformal with the protruding portions of each of the plurality of semiconductor fins, the gate stack comprising a gate dielectric layer and gate electrode; and
   source and drain regions disposed in the protruding portions of each of the plurality of semiconductor fins, on either side of the gate stack.

2. The semiconductor device of claim 1, wherein each of the plurality of semiconductor fins has an omega-fin geometry.

3. The semiconductor device of claim 1, wherein the protruding portion of each of the plurality of semiconductor fins has a width of approximately 10 nanometers or less.

4. The semiconductor device of claim 1, wherein the solid state dopant source layer has a top surface approximately co-planar with an interface between the sub-fin portion and the protruding portion of each of the plurality of semiconductor fins.

5. The semiconductor device of claim 1, wherein the isolation layer has a top surface approximately co-planar with an interface between the sub-fin portion and the protruding portion of each of the plurality of semiconductor fins.

6. The semiconductor device of claim 1, wherein the solid state dopant source layer is a borosilicate glass (BSG) layer.

7. The semiconductor device of claim 1, wherein the solid state dopant source layer is a phosphosilicate glass (PSG) layer or an arsenic silicate glass (AsSG) layer.

8. The semiconductor device of claim 1, further comprising:
   a capping layer disposed on and conformal with the solid state dopant source layer, wherein the isolation layer is disposed on the capping layer.

9. The semiconductor device of claim 8, wherein the capping layer comprises silicon nitride and has a top surface approximately co-planar with an interface between the sub-fin portion and the protruding portion of each of the plurality of semiconductor fins.

10. The semiconductor device of claim 1, further comprising:
    a dopant concentration interface between each protruding portion and corresponding sub-fin portion of each of the plurality of semiconductor fins.

11. The semiconductor device of claim 10, wherein the dopant concentration interface is an abrupt transition of less than approximately 5E17 atoms/$cm^3$ for each protruding portion and of greater than approximately 2E18 atoms/$cm^3$ for the corresponding sub-fin portion of each of the plurality of semiconductor fins.

12. The semiconductor device of claim 1, wherein the plurality of semiconductor fins disposed above the semiconductor substrate is a plurality of single crystalline silicon fins continuous with a bulk single crystalline silicon substrate.

13. A semiconductor device, comprising:
   a plurality of semiconductor fins disposed above a semiconductor substrate, each semiconductor fin having a sub-fin portion below a protruding portion, the sub-fin portion narrower than the protruding portion;
   a dopant concentration interface between each protruding portion and corresponding sub-fin portion of each of the plurality of semiconductor fins;
   an isolation layer disposed between the sub-fin portions of the plurality of semiconductor fins;
   a gate stack disposed above the isolation layer and conformal with the protruding portion of each of the plurality of semiconductor fins, the gate stack comprising a gate dielectric layer and gate electrode; and
   source and drain regions disposed in the protruding portions of each of the plurality of semiconductor fins, on either side of the gate stack.

14. The semiconductor device of claim 13, wherein each of the plurality of semiconductor fins has an omega-fin geometry.

15. The semiconductor device of claim 13, wherein the protruding portion of each of the plurality of semiconductor fins has a width of approximately 10 nanometers or less.

16. The semiconductor device of claim 13, wherein the isolation layer has a top surface approximately co-planar with an interface between the sub-fin portion and the protruding portion of each of the plurality of semiconductor fins.

17. The semiconductor device of claim 13, wherein the dopant concentration interface is an abrupt transition of less than approximately 5E17 atoms/cm³ for each protruding portion and of greater than approximately 2E18 atoms/cm³ for the corresponding sub-fin portion of each of the plurality of semiconductor fins.

18. The semiconductor device of claim 13, wherein the plurality of semiconductor fins disposed above the semiconductor substrate is a plurality of single crystalline silicon fins continuous with a bulk single crystalline silicon substrate.

19. An integrated structure, comprising:
   a first fin comprising a silicon material, the first fin having a lower fin portion and an upper fin portion and a shoulder feature at a region between the lower fin portion and the upper fin portion;
   a second fin comprising the silicon material, the second fin having a lower fin portion and an upper fin portion and a shoulder feature at a region between the lower fin portion and the upper fin portion;
   a layer comprising a phosphosilicate glass (PSG), the layer comprising the PSG directly on sidewalls of the lower fin portion of the first fin and directly on sidewalls of the lower fin portion of the second fin, the layer comprising the PSG having a first end portion substantially co-planar with the shoulder feature of the first fin, and the layer comprising the PSG having a second end portion substantially co-planar with the shoulder feature of the second fin;
   an insulating layer comprising nitrogen, the insulating layer directly on the layer comprising the PSG;
   a dielectric fill material directly laterally adjacent to the insulating layer; and
   a gate electrode over a top of and laterally adjacent to sidewalls of the upper fin portion of the first fin, and the gate electrode over a top of and laterally adjacent to sidewalls of the upper fin portion of the second fin, and the gate electrode over the dielectric fill material between the first fin and the second fin.

20. The integrated structure of claim 19, wherein the lower fin portion of the first fin has a width different than a width of the upper fin portion of the first fin at the region between the lower fin portion and the upper fin portion of the first fin, and wherein the lower fin portion of the second fin has a width different than a width of the upper fin portion of the second fin at the region between the lower fin portion and the upper fin portion of the second fin.

21. The integrated structure of claim 20, wherein the width of the lower fin portion of the first fin is less than the width of the upper fin portion of the first fin, and wherein the width of the lower fin portion of the second fin is less than the width of the upper fin portion of the second fin.

22. The integrated circuit structure of claim 20, wherein the layer comprising the PSG has a phosphorous concentration in the range of 0.1-10 weight %.

23. An integrated structure, comprising:
   a first fin comprising a silicon material, the first fin having a lower fin portion and an upper fin portion and a shoulder feature at a region between the lower fin portion and the upper fin portion;
   a second fin comprising the silicon material, the second fin having a lower fin portion and an upper fin portion and a shoulder feature at a region between the lower fin portion and the upper fin portion;
   a dielectric layer comprising an N-type dopant, the dielectric layer directly on sidewalls of the lower fin portion of the first fin and directly on sidewalls of the lower fin portion of the second fin, the dielectric layer having a first end portion substantially co-planar with the shoulder feature of the first fin, and the dielectric layer having a second end portion substantially co-planar with the shoulder feature of the second fin;
   an insulating layer comprising nitrogen, the insulating layer directly on the dielectric layer;
   a dielectric fill material directly laterally adjacent to the insulating layer; and
   a gate electrode over a top of and laterally adjacent to sidewalls of the upper fin portion of the first fin, and the gate electrode over a top of and laterally adjacent to sidewalls of the upper fin portion of the second fin, and the gate electrode over the dielectric fill material between the first fin and the second fin.

24. The integrated structure of claim 23, wherein the lower fin portion of the first fin has a width different than a width of the upper fin portion of the first fin at the region between the lower fin portion and the upper fin portion of the first fin, and wherein the lower fin portion of the second fin has a width different than a width of the upper fin portion of the second fin at the region between the lower fin portion and the upper fin portion of the second fin.

25. The integrated structure of claim 24, wherein the width of the lower fin portion of the first fin is less than the width of the upper fin portion of the first fin, and wherein the width of the lower fin portion of the second fin is less than the width of the upper fin portion of the second fin.

26. The integrated circuit structure of claim 23, wherein the N-type dopant is phosphorous, and wherein the dielectric layer has a phosphorous concentration in the range of 0.1-10 weight %.

27. The integrated circuit structure of claim 23, wherein the N-type dopant is arsenic, and wherein the dielectric layer has an arsenic concentration in the range of 0.1-10 weight %.

* * * * *